(12) United States Patent
Mignot et al.

(10) Patent No.: US 10,629,436 B2
(45) Date of Patent: Apr. 21, 2020

(54) SPACER IMAGE TRANSFER WITH DOUBLE MANDREL

(71) Applicant: INTERNATIONAL BUSINESS MACHINES CORPORATION, Armonk, NY (US)

(72) Inventors: Yann Mignot, Slingerlands, NY (US); Yongan Xu, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/951,266

(22) Filed: Apr. 12, 2018

(65) Prior Publication Data
US 2019/0318928 A1 Oct. 17, 2019

(51) Int. Cl.
| | |
|---|---|
| H01L 21/033 | (2006.01) |
| H01L 21/308 | (2006.01) |
| H01L 21/8234 | (2006.01) |
| H01L 29/66 | (2006.01) |
| H01L 21/311 | (2006.01) |
| H01L 21/768 | (2006.01) |

(Continued)

(52) U.S. Cl.
CPC ...... *H01L 21/0337* (2013.01); *H01L 21/0332* (2013.01); *H01L 21/3081* (2013.01); *H01L 21/3086* (2013.01); *H01L 21/31111* (2013.01); *H01L 21/76802* (2013.01); *H01L 21/76877* (2013.01); *H01L 21/823431* (2013.01); *H01L 21/823468* (2013.01); *H01L 29/6653* (2013.01); *H01L 29/6656* (2013.01); *H01L 21/0276* (2013.01); *H01L 21/3065* (2013.01); *H01L 21/31122* (2013.01); *H01L 21/31138* (2013.01); *H01L 21/823475* (2013.01)

(58) Field of Classification Search
CPC ............. H01L 21/0337; H01L 21/0332; H01L 21/3081; H01L 21/3086; H01L 21/31111; H01L 21/76802; H01L 21/76877; H01L 21/823431; H01L 21/823468; H01L 21/0276; H01L 21/3065; H01L 21/31122; H01L 21/31138; H01L 21/823475; H01L 29/6653; H01L 29/6656
See application file for complete search history.

(56) References Cited

U.S. PATENT DOCUMENTS

| | | | |
|---|---|---|---|
| 8,525,235 B2 | 9/2013 | Cheng et al. | |
| 9,023,224 B2 | 5/2015 | Wang et al. | |
| 9,093,378 B2 | 7/2015 | Kim et al. | |

(Continued)

FOREIGN PATENT DOCUMENTS

WO 2016/039869 A1 3/2016

*Primary Examiner* — Joseph M Galvin, III
(74) *Attorney, Agent, or Firm* — Tutunjian & Bitetto, P.C.; Vazken Alexanian (57) ABSTRACT

A method for providing an etch mask for microelectronic processing that includes forming a material stack on a surface to be etched, wherein the material stack of at least a first material layer atop the surface to be etched for a base mandrel layer, and a second material layer atop the first material layer to provide a cap mandrel layer. If a following step, the material stack may be patterned and etched to provide double mandrel structures each including said base mandrel layer and said cap mandrel layer. A sidewall spacer is formed on sidewalls of the double mandrel structures.

18 Claims, 7 Drawing Sheets

(51) Int. Cl.
   *H01L 21/027* (2006.01)
   *H01L 21/3065* (2006.01)

(56) References Cited

U.S. PATENT DOCUMENTS

| | | |
|---|---|---|
| 9,397,005 B1 | 7/2016 | Lee et al. |
| 9,564,342 B2 | 2/2017 | Ogasawara |
| 9,634,090 B2 | 4/2017 | Rim et al. |
| 9,761,452 B1 | 9/2017 | Shu et al. |
| 2008/0057692 A1 | 3/2008 | Wells et al. |
| 2009/0311634 A1 | 12/2009 | Yue et al. |
| 2013/0244437 A1* | 9/2013 | Flachowsky ........ H01L 21/3086 438/703 |
| 2014/0017889 A1 | 1/2014 | Lee et al. |
| 2014/0167119 A1 | 6/2014 | Javorka et al. |
| 2014/0273441 A1 | 9/2014 | Kim et al. |
| 2015/0056800 A1 | 2/2015 | Mebarki et al. |
| 2015/0093902 A1* | 4/2015 | Huang ................ H01L 21/0337 438/703 |
| 2016/0093501 A1 | 3/2016 | Ogasawara |
| 2016/0372334 A1* | 12/2016 | Mignot ............. H01L 21/31116 |
| 2018/0114721 A1* | 4/2018 | Mohanty ............. H01L 21/0332 |
| 2018/0138078 A1* | 5/2018 | Farrell .............. H01L 21/31144 |

* cited by examiner

SPACER IMAGE TRANSFER WITH DOUBLE MANDREL

BACKGROUND

Technical Field

The present invention generally relates to microelectronic processing, and more particularly to masking structures used in combination with lithography to shape features of electronics of microscale or less.

Description of the Related Art

Micro-processor systems of integrated circuits (IC) are ubiquitous devices, which are utilized in diverse fields such as automatic control electronics, mobile communication devices and personal computers. With the development of technologies and the increasingly imaginative applications of the electrical products, the IC devices become smaller, more delicate and more diversified. Semiconductor device manufacturers utilize a pattern transfer technique, such as the sidewall image transfer (SIT). However, since the critical dimensions (CD) of fin structures is becoming smaller, many problems are met during the manufacturing process. Therefore, there is still a need for a novel SIT processes that can meet the CD requirement and reduce the manufacturing errors, so as to upgrade the yield of the products.

SUMMARY

In accordance with an embodiment of the present invention, a method is provided for microelectronics processing that employs a double mandrel structure for masking in an etch process. In one embodiment, the method may include forming a material stack on a surface to be etched, wherein the material stack of at least a first material layer atop the surface to be etched for a base mandrel layer, and a second material layer atop the first material layer to provide a cap mandrel layer. If a following step, the material stack may be patterned and etched to provide double mandrel structures each including said base mandrel layer and said cap mandrel layer. A sidewall spacer is formed on sidewalls of the double mandrel structures.

In another embodiment, a back end of the line (BEOL) process is employed to provide at least one metal line using a double mandrel structure for providing etch masking. In one embodiment, the method may include forming a material stack on a surface to be etched, wherein the material stack of at least a first material layer atop the surface to be etched for a base mandrel layer, and a second material layer atop the first material layer to provide a cap mandrel layer. If a following step, the material stack may be patterned and etched to provide double mandrel structures each including said base mandrel layer and said cap mandrel layer. A sidewall spacer is formed on sidewalls of the double mandrel structures. The double mandrel structures and sidewall spacers are used for the masking for patterning trenches in underlying dielectric layers. The trenches are filled with an electrically conductive material to provide metal lines.

In yet another embodiment, a front end of the line (FEOL) process is employed that uses a double mandrel structure as masking to provide at least one fin structure from an underlying semiconductor material layer. In one embodiment, the method may include forming a material stack on a surface to be etched, wherein the material stack of at least a first material layer atop the surface to be etched for a base mandrel layer, and a second material layer atop the first material layer to provide a cap mandrel layer. If a following step, the material stack may be patterned and etched to provide double mandrel structures each including said base mandrel layer and said cap mandrel layer. A sidewall spacer is formed on sidewalls of the double mandrel structures. The double mandrel structures and sidewall spacers are used for the masking for etching fin structures in underlying semiconductor material layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein increase the flexibility of sidewall image transfer (SIT) processing. Spacer image transfer (SIT) processing is defined with a mandrel covered with a spacer to allow for a critical dimension shrink. Generally, mandrel height and critical dimension are fixed based on the final critical dimension (CD) and etch selectively. In some embodiments, the methods and structures described herein employ a mandrel that is composed of multiple material layers of different composition to provide extra selectively and control in lithography type patterning processes. In some embodiments, the multiple, e.g., double layer mandrel (sometimes referred to as double mandrel), can provide for a minimized recess during the mandrel burnoff step of the process sequence. In some embodiments, the multiple, e.g., double layer mandrel (sometimes referred to as double mandrel), can be utilized to easily change the spacer height. In yet other embodiments, the multiple, e.g., double layer mandrel (sometimes referred to as double mandrel), can be employed for an alternative stack for self aligned block (SAB).

In one embodiment, the double layer mandrel designs described herein may be employed in a self-aligned quadruple patterning (SAQP) process, which can allow for a multiple pitch design. In some examples using this process, from a plurality of fin structure at least two FIN semiconductor devices, and at least three metal lines, e.g., copper metal lines, can be patterned with variable space base on the mandrel critical dimension (CD).

In one embodiment, the dual layer mandrel designs described herein provide for lithography rework for both mandrel and non-mandrel patterning. Previous methods employ a single mandrel method, in which a spin on hardmask (SOH) has to be used as the reactive ion etching (RIE) hardmask. The spin on hardmask (SOH) is from the lithography stack. The spin on hardmask (SOH) reactive ion etch (RIE) chemistry during rework is corrosive to the underlying hardmask (HM), e.g., silicon oxynitride (SiON) hardmask. This can improve selectivity against silicon anti reflective coating (SiArc) burn off and the bottom mandrel. The methods and structures of the present disclosure are now discussed with more detail referring to FIGS. 1-26.

FIGS. 1-5 depict one embodiment of forming a double mandrel structure for sidewall image transfer (SIT). By "double mandrel structure" it is meant that each mandrel structure that sidewall spacers are formed on includes a stack of at least two material layers. Each double mandrel structure includes at least a base layer and an upper layer.

Figure 1:
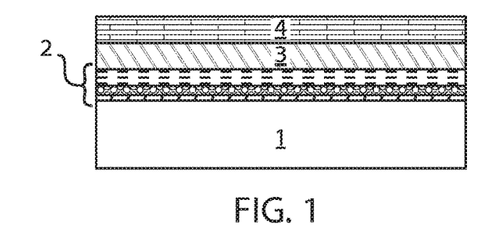
FIG. 1 is a side cross-sectional view depicting one embodiment of material stack that can provide an initial structure for at least one embodiment of a double mandrel lithography process, in accordance with the present disclosure.

FIG. 1 depicts one embodiment of material stack that can provide an initial structure for at least one embodiment of a double mandrel lithography process. The first layer 1 of the initial structure may be a substrate material, such as a type IV and/or type III-V semiconductor material that can provide the composition of a fin structure; or a line level and/or via level dielectric, such as a low-k dielectric layer. The first layer 1 may hereafter be referred to as substrate or a line level and/or via level dielectric having reference number 1. The term "III-V semiconductor material" denotes a semiconductor material that includes at least one element from Group IIIB of the Periodic Table of Elements under the Old International Union of Pure and Applied Chemistry (IU-PAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material that provides the III-V semiconductor substrate may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

As used herein, the term "low-k" denotes a dielectric material having a dielectric constant equal to the dielectric constant of silicon oxide ($SiO_2$) or less. The low-k dielectric for the line and/or via level can have a dielectric constant that is less than 7.0, e.g., 5.5. In one embodiment, the low-k dielectric material has a dielectric constant ranging from 3.9 to 6. In another embodiment, the low-k dielectric material has a dielectric constant less than 3.9. In some embodiments, the low-k dielectric material may be an ultra-low k (ULK) dielectric material having a dielectric constant of 2.6 or less. Examples of materials suitable for the low-k dielectric for the line and/or via level include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

In some embodiments, at least one hard mask dielectric layer 2 can be present atop the substrate or a line level and/or via level dielectric having reference number 1. The hard mask dielectric layer 2 may be composed of a nitride containing dielectric, such as silicon nitride, silicon carbon nitride or combinations thereof. In some embodiments, the hard mask dielectric layer 2 may be composed of a metal nitride, such as titanium nitride (TiN), tantalum nitride (TaN), tungsten nitride (WN), platinum nitride and combinations thereof.

Still referring to FIG. 1, the material stack that can provide one example of an initial structure for at least one embodiment of a double mandrel lithography process may further include at least two stacked material layers for the double mandrel structure. The materials for the stacked material layers of the double mandrel structure are selected considering etch selectivity factors. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1.

For example, a cap mandrel layer 4 for the double mandrel structure may be composed of amorphous silicon (a-Si). It is noted that this is only one example of a composition that can be suitable for the cap mandrel layer 4. The cap mandrel layer 4 may also be composed of hydrogenated amorphous silicon (a-Si:H), amorphous silicon carbon (a-SiC), amorphous hydrogenated silicon carbon (a-SiC:H) and combinations thereof including combinations with amorphous silicon (a-Si). The base cap layer 4 may be in direct contact with a base mandrel layer 3, in which the base mandrel layer 3 is in direct contact with the at least one hard mask dielectric layer 2. The base mandrel layer 3 may be composed of a titanium containing material layer, i.e., a material layer of titanium (Ti) and other elements. For example, the base mandrel layer 3 may be composed of titanium oxide (TiOx), e.g., titanium dioxide ($TiO_2$), titanium oxynitride, a titanium antireflective coating (TiARC) or a combination thereof.

Each material layer for the cap mandrel layer 4 and the base mandrel layer 3 may be formed using a deposition process, such as chemical vapor deposition, e.g., plasma enhanced chemical vapor deposition (PECVD). In other examples, each material layer for the cap mandrel layer 4 and the base mandrel layer 3 may be formed using spin on deposition. The thickness for each of the cap mandrel layer 4 and the base mandrel layer 3 may have a thickness ranging from 2 nm to 50 nm. In some embodiments, the thickness for each of the cap mandrel layer 4 and the base mandrel layer 3 can range from 5 nm to 50 nm.

Figure 2:
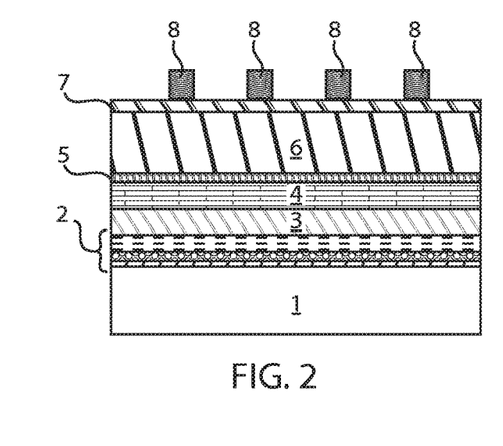
FIG. 2 is a side cross-sectional view depicting one embodiment of a lithography step for patterning mandrels from the layered material stack that is depicted in FIG. 1.

FIG. 2 depicts one embodiment of a lithography step for patterning mandrels from the layered material stack that is depicted in FIG. 1. The lithography step may begin with forming a lithography stack that is composed of a low temperature oxide layer (LTO) 5, an organic planarization layer (OPL) 6, and a silicon anti-reflective coating (SiArc) 7. After forming the lithography stack it may be patterned using a photoresist mask 8.

Figure 3:
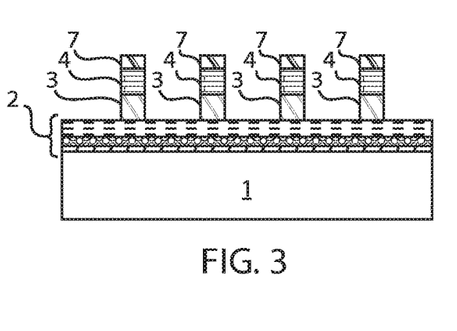
FIG. 3 is a side cross-sectional view depicting one embodiment of an etch process applied to the structure depicted in FIG. 2 for the purposes of providing a mandrel etch.

Specifically, in one example, a photoresist mask 8 is formed overlying the layer of the lithography stack, in which the portion of the lithography stack that is underlying the photoresist mask is overlying the double mandrel structures. The exposed portions of the lithography stack and the exposed portions for each material layer for the cap mandrel layer 4 and the base mandrel layer 3, which are not protected by the photoresist mask 8, are removed using a selective etch process, as depicted in FIG. 3.

Referring to FIG. 2, to provide the photoresist mask 8, a photoresist layer is first positioned on the lithographic stack. The photoresist layer may be provided by a blanket layer of photoresist material that is formed using a spin-on coating. The blanket layer of photoresist material is then patterned to provide the photoresist mask 8 utilizing a lithographic process that may include exposing the photoresist material to a pattern of radiation and developing the exposed photoresist material utilizing a resist developer.

Following the formation of the photoresist mask 8, an etching process may remove the unprotected portions of the lithographic stack followed by removing the unprotected portions of the cap mandrel layer 4 and the base mandrel layer 3, in which the remaining portions of the cap mandrel layer 4 and the base mandrel layer 3 provide the double mandrel structures. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation. Some examples of etch chemistries may include a $CF_x$ based etch for etching material layers that are silicon containing antireflective coatings (SiARC) layers and/or low temperature oxide (LTO) layers. Organic planarization layers (OPLs) may be etched using a etch chemistry of $N_2/H_2$ or HBr/He and/or $CO/CO_2$ and/or $CO/SO_2$. The cap mandrel layer 4 and/or the base mandrel layer 3 can be etched using an etch chemistry composed of $Cl_2/Ar/CH_4$).

It is noted that although the double mandrel structures 10 are depicted as only having two material layers, i.e., the cap mandrel layer 4 and the base mandrel layer 3, the double mandrel structures 10 are not limited to only this example. In other examples, the number of layers in the stacked structure that provides the double mandrel structure 10 may range from 2-5 layers.

Figure 4:
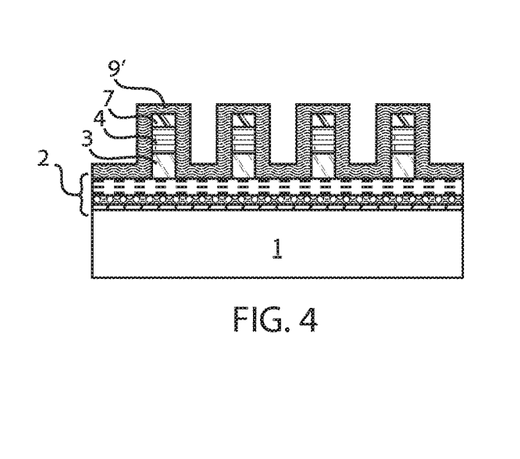
FIG. 4 is a side cross-sectional view depicting one embodiment of a conformal deposition of a material layer for a sidewall spacer to be formed on the mandrels depicted in FIG. 3.
Figure 5:
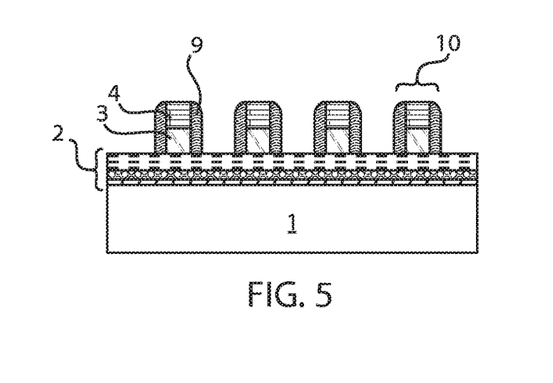
FIG. 5 is a side cross-sectional view depicting one embodiment of etching the conformally deposited material layer depicted in FIG. 4 to provide sidewall spacers on a mandrel of two stacked material layers.

Referring to FIGS. 4 and 5, in some embodiments, the sidewall image transfer (SIT) process may continue by forming a dielectric spacer 9 on each sidewall of each double mandrel structure 10. The dielectric spacer can be formed by deposition of a dielectric spacer material, and then etching the deposited dielectric spacer material. FIG. 4 depicts one embodiment of a conformal deposition of a dielectric spacer material layer 9' for a sidewall spacer 9 to be formed on the mandrel structures 10 depicted in FIG. 3. The dielectric spacer material 9 may comprise any dielectric spacer material such as, for example, silicon dioxide, silicon nitride or a dielectric metal oxide.

The dielectric spacer material 9 may be formed using a conformal deposition process. The term "conformal" denotes a layer having a thickness that does not deviate from greater than or less than 30% of an average value for the thickness of the layer. A conformal deposition process provides a conformal layer. Examples of conformal deposition processes that can be used in providing the dielectric spacer material include, but are not limited to, chemical vapor deposition (CVD), plasma enhanced chemical vapor deposition (PECVD), or atomic layer deposition (ALD). FIG. 5 depicts one embodiment of etching the dielectric spacer material layer 9' depicted in FIG. 4 to provide sidewall spacers 9 on the double mandrel structures 10 of two stacked material layers, i.e., the cap mandrel layer 4 and the base mandrel layer 3. The etching of the dielectric spacer material layer 9' may be referred to as a spacer etch back (SEB) process. Examples of etching that be used in providing the dielectric spacers 9 include any etching process such as, e.g., reactive ion etching (RIE). Etch chemistries for forming the dielectric spacers are generally based on $CF_x$ species, such as $CH_3F$.

The double mandrel structures 10 that have been formed using the process described with reference to FIGS. 1-5 may be used in a self-aligned block (SAB) process flow and/or a self-aligned quadruple patterning (SAQP) process. FIGS. 6-19 describe some embodiments of a self-aligned block (SAB) process flow using the double mandrel structure 10 that has been described with reference to FIGS. 1-5.

Figure 6:
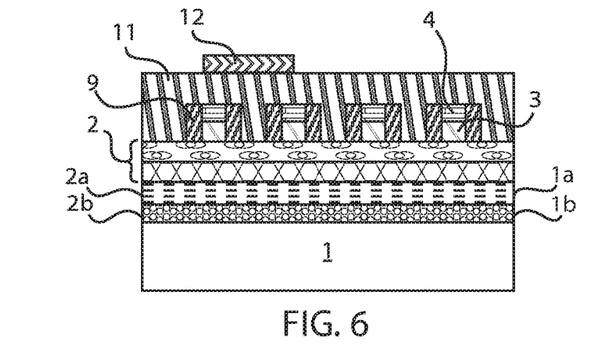
FIG. 6 is a side cross-sectional view of one step of a self-aligned block (SAB) process flow having a sequence having a sequence that cuts a non-mandrel region first, following by a mandrel cut, in which the process flow can begin with the formation of an organic planarization layer and anti-reflective coating to provide a non-mandrel cut, in accordance with one embodiment of the present disclosure.

FIG. 6 depicts one step of a self-aligned block (SAB) process flow having a sequence having a sequence that cuts a non-mandrel region first, following by a mandrel cut, in which the process flow can begin with the formation of an organic planarization layer and anti-reflective coating to provide a non-mandrel cut. The non-mandrel regions are the regions of the structure that are present between the mandrel structures 10. The non-mandrel regions is present in the space between adjacent mandrel structures 10. The mandrel cut is performed in the regions of the structure that are underlying the double mandrel structures 10.

Referring to FIG. 6, a first organic planarization layer (OPL) 11 is deposited, e.g., deposited by a process such as spin on deposition and/or chemical vapor deposition (CVD), and may be planarized, e.g., planarized by chemical mechanical planarization (CMP), to provide a planar upper surface. The first organic planarization layer (OPL) layer 11 may be composed of an organic polymer that may include polyacrylate resin, epoxy resin, phenol resin, polyamide resin, polyimide resin, unsaturated polyester resin, polyphenylenether resin, polyphenylenesulfide resin, or benzocyclobutene (BCB).

A first antireflective coating 12 may be formed atop the first organic planarization (OPL) layer 11. The first antireflective coating 12 may be a SiARC layer, i.e., silicon containing anti-reflective coating, and may include a silicon-containing polymer. In one embodiment, the first SiARC layer comprises silicon at an atomic concentration from 1% to 50%. The first antireflective coating 12 layer may be applied, for example, by spin coating.

Figure 7:
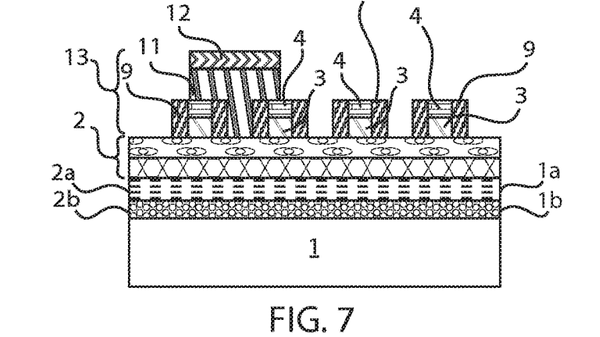
FIG. 7 is a side cross-sectional view depicting a first block position for a non-mandrel etch step from the structure depicted in FIG. 6.

Referring to FIGS. 6 and 7, the first antireflective coating 12 and the first organic planarization layer (OPL) 11 are then patterned to provide a first block 13 positioned for a non-mandrel etch step from the structure depicted in FIG. 6. The first block 13 may be patterned from the first antireflective coating 12 and the first organic planarization layer 11 using photolithography and etch processes.

Figure 8:
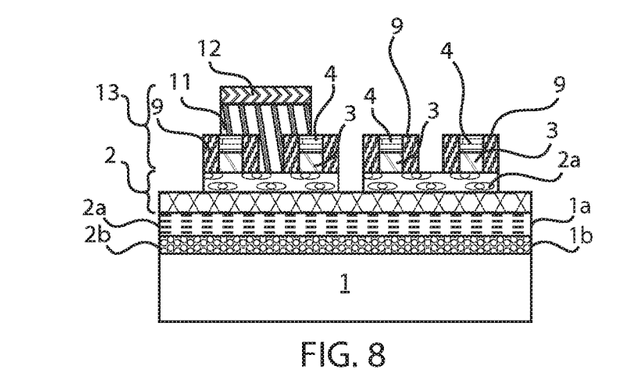
FIG. 8 is a side cross-sectional view depicting a non-mandrel cut using the first block position following nitride open and removal of the anti-reflective coating.

FIG. 8 depicts one embodiment of a non-mandrel cut using the first block 13 following nitride open and removal of the anti-reflective coating 12 and the first organic planarization layer 11. In the embodiment that is depicted in FIG. 8, the at least one hard mask dielectric layer 2 includes an upper layer of silicon nitride 2a, and a lower layer of titanium nitride 2b. FIG. 8 depicts a non-mandrel cut for etching the silicon nitride layer 2a using the first block 13 and the double mandrel structures 10 (including sidewall spacers 9) as an etch mask. The etch will remove the silicon nitride layer 2a selectively to the titanium nitride layer 2b. The etch process may be anisotropic, and can include a reactive ion etching (RIE) processes, which can have an etch chemistry, such as a $CH_3F/Ar/O_2$. This etch sequence will burn off the first antireflective coating 12. After the non-mandrel cut, the first block 13 formed by the first organic planarization layer 11 only may be removed using a selective etch process such as $N_2/H_2$ or HBr/He and/or $CO/CO_2$ and/or $CO/SO_2$ plus oxygen.

Figure 9:
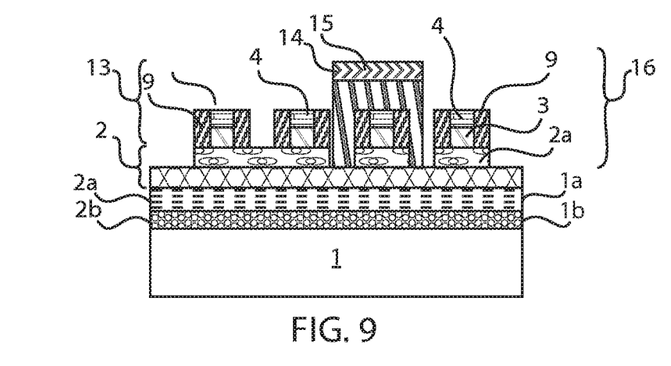
FIG. 9 is a side cross-sectional view depicting a second block for a second non-mandrel etch applied to the structure depicted in FIG. 8.

FIG. 9 depicts one embodiment of a second block 16 for a second non-mandrel etch applied to the structure depicted in FIG. 8. The second block 16 may be composed of a second organic planarization layer 14, and a second antireflective coating 15. The second block 16 is similar to the first block 13 that has been described above with reference to FIGS. 6 and 7. Therefore, the description of the method of forming the first block 13 and the compositions of the first antireflective coating 12 and the first organic planarization layer 11 are suitable for describing the method of forming the second block 16, and the compositions for the second organic planarization layer 14, and the second antireflective coating 15 that are depicted in FIG. 9. The second block 16 is positioned over one of the double mandrel structures 10. The second block 16 protects the double mandrel structure 10 that it is covering from having the silicon nitride 2a layer being removed. This occurs during a process step when the layer of silicon nitride 2a is removed from the double mandrel structures 10 that are exposed, as will be described with reference to FIG. 10.

Figure 10:
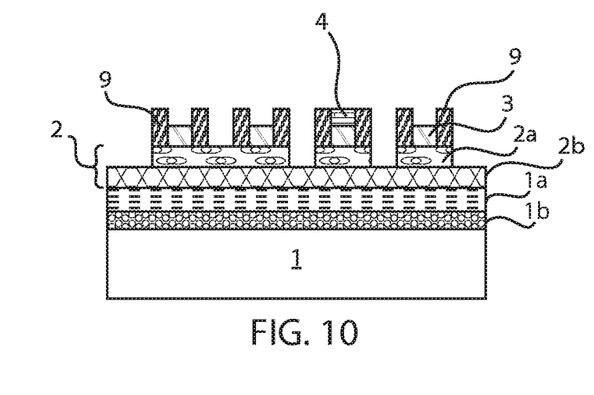
FIG. 10 is a side cross-sectional view depicting one embodiment of employing the second block to protect one of the layers of the double layer mandrel from one mandrel structure, while the upper layer of the exposed double layer mandrels is removed.

FIGS. 9 and 10 depict one embodiment of employing the second block 16 to protect the layers of one double mandrel structure 10, while the upper layer, i.e., cap mandrel layer 4, of the exposed double layer mandrels 10 is removed. In some embodiments, the etch process for removing the cap mandrel layer 4, e.g., amorphous silicon containing layer, of the exposed double mandrel structures 10 is selective to the second block 16. In some embodiments, the etch process for removing the cap mandrel layer 4, e.g., amorphous silicon containing layer, of the exposed double mandrel structures 10 may also be selective to the base mandrel layer 3, e.g., titanium containing material layer. In some embodiments, the etch process for removing the silicon nitride layer 2a of the exposed double mandrel structures 10 may also be selective to the titanium nitride layer 2b. The etch process at this stage of the process flow may be a directional etch, such as reactive ion etch (RIE). In other embodiments, the etch process at this stage of the process flow may also be a non-directional etch, such as a wet chemical etch.

Figure 11:
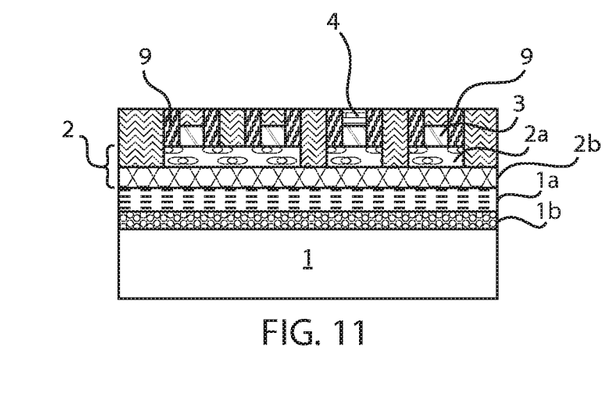
FIG. 11 is a side cross-sectional view depicting forming an organic planarization layer on the structure depicted in FIG. 10.

FIG. 11 depicts forming a third organic planarization layer 17 on the structure depicted in FIG. 10. The third organic planarization layer 17 can be deposited by a process such as spin on deposition and/or chemical vapor deposition (CVD), and may be planarized, e.g., planarized by chemical mechanical planarization (CMP), to provide a planar upper surface. The third organic planarization layer (OPL) layer 17 may be composed of an organic polymer that may include polyacrylate resin, epoxy resin, phenol resin, polyamide resin, polyimide resin, unsaturated polyester resin, polyphenylenether resin, polyphenylenesulfide resin, benzocyclobutene (BCB) or combinations thereof. Referring to FIG. 11, the third planarization layer 17 fills both the space between mandrel structures, and the recessed formed in the mandrel structures by removing cap mandrel layer 4.

Figure 12:
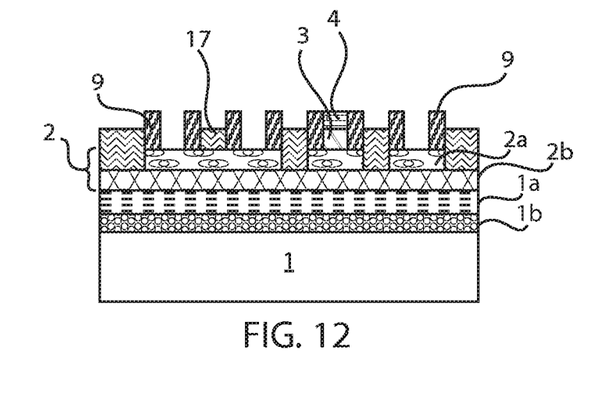
FIG. 12 is a side cross-sectional view depicting removing the second layer from the double layer mandrel of the exposed mandrel structures.

FIG. 12 depicts removing the second layer, i.e., base layer 3, from the double layer mandrel of the exposed mandrel structures. More specifically, each of the exposed base layers 3, e.g., Ti containing layers, of the double mandrel structures 10, which were exposed by removing the cap layer 4, described with reference to FIG. 10, can be removed by an etch process. For example, a selective etch process may remove the exposed base layers 3 of the double mandrel structures selectively to at least the remaining cap layer of the double mandrel structure 10. The etch process for removing the exposed base layers 3 of the double mandrel structures 10 may also be selective to the sidewall spacers 9, and the remaining portion of the silicon nitride layer 2a of the at least one hardmask layer 2. In some embodiments, the etch process for removing the exposed base layers 3 can also recess the third organic planarization layer 17. The etch process at this stage of the process flow may be a directional etch, such as reactive ion etch (RIE) using a $Cl_2/Ar/CH_4$. In other embodiments, the etch process at this stage of the process flow may also be a non-directional etch, such as a wet chemical etch. In a following process step, the second block 16 may be removed.

Figure 13:
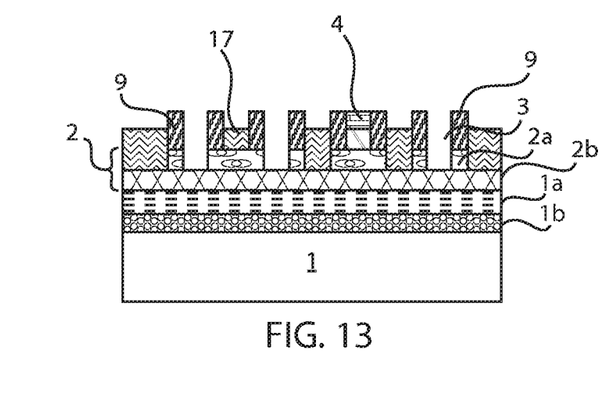
FIG. 13 is a side cross-sectional view depicting a mandrel cut of an underlying dielectric layer using the openings provided by removing the second layer of the exposed mandrel structures.

FIG. 13 depicts a mandrel cut of an underlying dielectric layer, i.e., the silicon nitride layer 2a of the at least one hardmask 2, using the openings provided by removing the second layer, i.e., base payer 3, e.g., amorphous carbon containing layer, of the exposed mandrel structures. The mandrel cut may be provided by an etch process. For example, a selective etch process may remove the exposed portions of the silicon nitride layer 2a selectively to at least one of the sidewall spacers 9, the third organic planarization player 17, the remaining cap layer 4 of the mandrel structure 10, and the titanium nitride layer 2b of the at least one hardmask layer 2. The etch process at this stage of the process flow may be a directional etch, such as reactive ion etch (RIE). In other embodiments, the etch process at this stage of the process flow may also be a non-directional etch, such as a wet chemical etch.

Figures 14, 16:
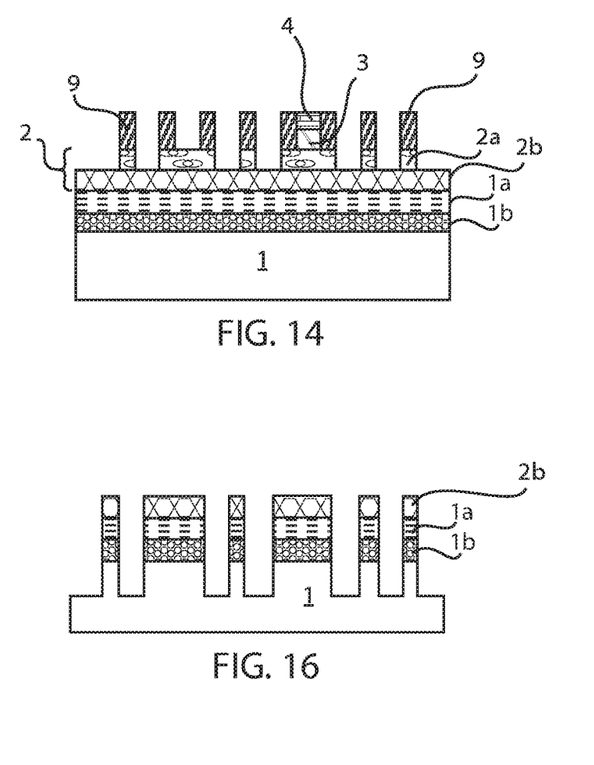
FIG. 14 is a side cross-sectional view depicting removing the second organic planarization layer from the structure depicted in FIG. 13.
FIG. 16 is a side cross-sectional view depicting etching an underlying dielectric layer as part of a back end of the line (BEOL) process flow using the mask structure depicted in FIG. 15.

FIG. 14 depicts one embodiment of removing the third organic planarization layer 17 from the structure depicted in FIG. 13. The third organic planarization layer 17 may be removed by an etch process. For example, organic planarization layers (OPLs) may be etched using a etch chemistry of $N_2/H_2$ or HBr/HE and/or $CO/CO_2$ and/or $CO/SO_2$.

Figure 15:
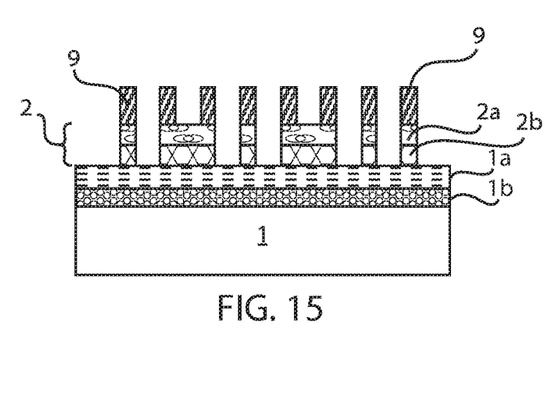
FIG. 15 is a side cross-sectional view depicting removing a remaining portion of the double layer mandrel that is depicted in FIG. 14 to provide a mask ready for dielectric reactive ion etching and via patterning, in accordance with one embodiment of the present disclosure.

FIG. 15 depicts one embodiment of removing the remaining double mandrel structure 10 that is depicted in FIG. 14 to provide a mask for patterning the underlying dielectric layers, e.g., the at least one hardmask layer 2. In some embodiments, the remaining double mandrel structure 10 may be removed by a selective etch process, such as reactive ion etching (RIE) and/or wet chemical etching. Still referring to FIG. 15, the structure may then provide a mask that is suitable for dielectric reactive ion etching (RIE) and via patterning. For example, the titanium nitride layer 2b of the at least one hard mask 2 may be etched using an anisotropic etch, such as reactive ion etching (RIE). The etch process may terminate on the substrate or a line level and/or via level dielectric having reference number 1.

Figure 17:
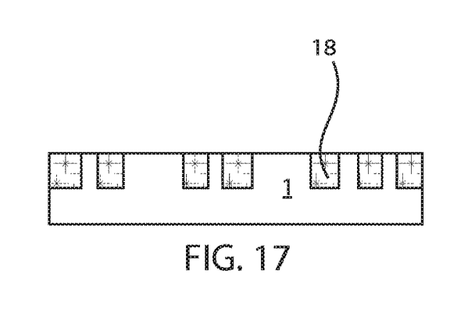
FIG. 17 is a side cross-sectional view depicting forming metal lines in the trenches depicted in FIG. 16 as part of a back end of the line (BEOL) process flow.
Figure 18:
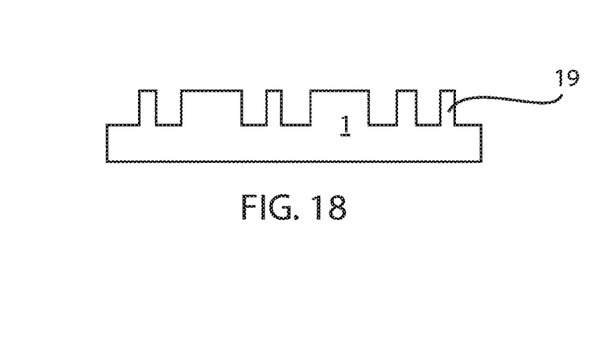
FIG. 18 is a side cross-sectional view depicting etching an underlying semiconductor layer as part of a front end of the line (FEOL) process flow to form fin structures using the mask structure depicted in FIG. 15.

The pattern provided by the structure depicted in FIG. 15 can then be transferred into the underlying substrate or a line level and/or via level dielectric having reference number 1. The pattern may be transferred using an etch process, such as an anisotropic etch process, e.g., reactive ion etching (RIE). FIG. 16 depicts etching an underlying dielectric layer 1a, 1b, 1 as part of a back end of the line (BEOL) process flow using the mask structure depicted in FIG. 15. FIG. 17 depicts forming metal lines 18 in the trenches depicted in FIG. 16 as part of a back end of the line (BEOL) process flow. The metal lines 18 may be formed using a plating and/or physical vapor deposition (PVD) process. The metal lines 18 may be composed of copper, aluminum, silver, platinum, tungsten and combinations thereof. In other embodiments, the pattern provided by the structure depicted in FIG. 15 can then be transferred into the underlying substrate of a semiconductor material to provide a fin structure 19 as part of a front end of the line (FEOL) process. FIG. 18 depicts etching an underlying semiconductor layer as part of a front end of the line (FEOL) process flow to form fin structures 19 using the above described masking structures.

It is noted that the process flow that has been described with reference to FIGS. 1-18 is only one example of a process flow that is suitable for use with the double mandrel structures of the present disclosure. For example, FIGS. 19-22 depict one embodiment of a process flow employing a self-aligned block (SAB) having a sequence that cuts a mandrel region first, following by a non-mandrel cut.

Figure 19:
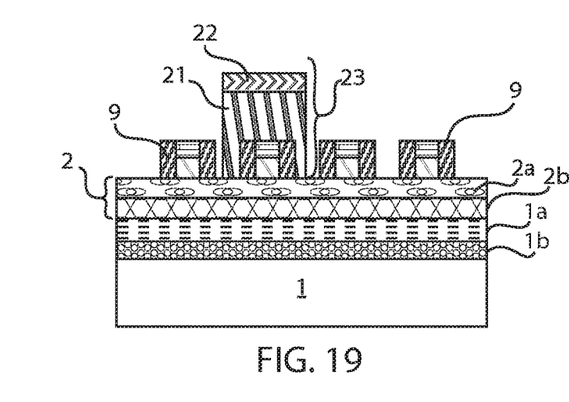
FIG. 19 is a side cross-sectional view depicting one step of a self-aligned block (SAB) process flow having a sequence that cuts a mandrel region first, following by a non-mandrel cut, in which the process flow can begin with the formation of a first block of an organic planarization layer and anti-reflective coating to protect one of the mandrel structures, while removing the upper layer of the double mandrel structure to provide a mask for a mandrel cut, in accordance with one embodiment of the present disclosure.

FIG. 19 depicts one step of a self-aligned block (SAB) process flow having a sequence that cuts a mandrel region first, following by a non-mandrel cut, like in FIG. 5, in which the process flow can begin with the formation of a block 23 of an organic planarization layer (OPL) 21 and anti-reflective coating 22 (plus a photoresist) to protect one of the mandrel structures 10, while removing the upper layer, i.e., cap layer 4, of the double mandrel structure that are exposed to provide a mask for a mandrel cut.

Figure 20:
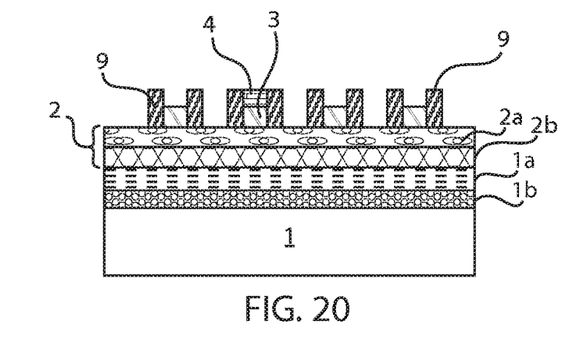
FIG. 20 is a side cross-sectional view depicting removing the second layer of the exposed double mandrel structures selectively to the first layer of the double mandrel structures, in accordance with one embodiment of the present disclosure.

FIG. 20 depicts removing the second layer, i.e., cap mandrel layer 4, of the exposed double mandrel structures selectively to the first layer, i.e., base layer 3, of the double mandrel structures.

Figure 21:
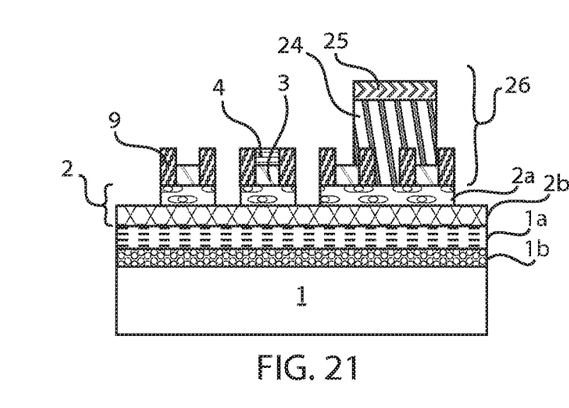
FIG. 21 is a side cross-sectional view depicting one embodiment of forming a second block over a non-mandrel portion of the structure depicted in FIG. 20.

FIG. 21 depicts one embodiment of forming a block over a non-mandrel portion of the structure depicted in FIG. 20. The block 26 that is depicted in FIG. 21 may include an organic planarization layer (OPL) 24 and an anti-reflective coating 25. The block 26 may also include a photoresist layer.

Figure 22:
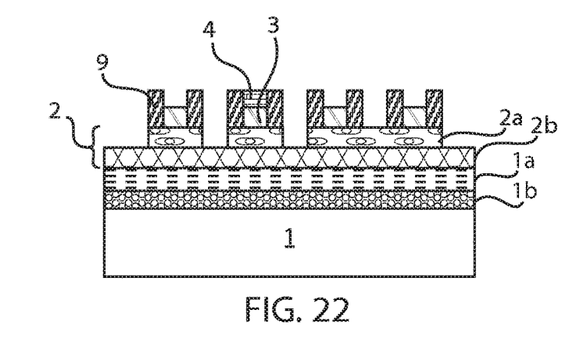
FIG. 22 is a side cross-sectional view depicting removing the exposed portions of underlying dielectric material in the non-mandrel portions of the structure depicted in FIG. 21 selectively to the second block, and removing the second block, in accordance with one embodiment of the present disclosure.

FIG. 22 depicts removing the exposed portions of underlying dielectric material, e.g., silicon nitride layer 2a, in the non-mandrel portions of the structure depicted in FIG. 21 selectively to the second block 26, and removing the second block 26.

Following the steps depicted in FIGS. 19-22, the process may continue with the steps that are described above with reference to FIGS. 10-18.

It is noted that the process flow that has been described with reference to FIGS. 1-22 only describe some examples of process flows that are suitable for use with the double mandrel structures of the present disclosure. For example, FIGS. 23-26 depict one embodiment of a self-aligned quadruple patterning (SAQP) process that employs the double mandrel structure that is described above with reference to FIGS. 1-5. In the embodiment depicted with reference for FIGS. 23-26, a different critical dimension (CD) can be achieved by modulating the thickness (b) of the first sidewall spacers 9, by modulating the critical dimension (a) of the double mandrel 3, 4, and by modulating the thickness (c) of the second sidewall spacers 27.

Figure 23:
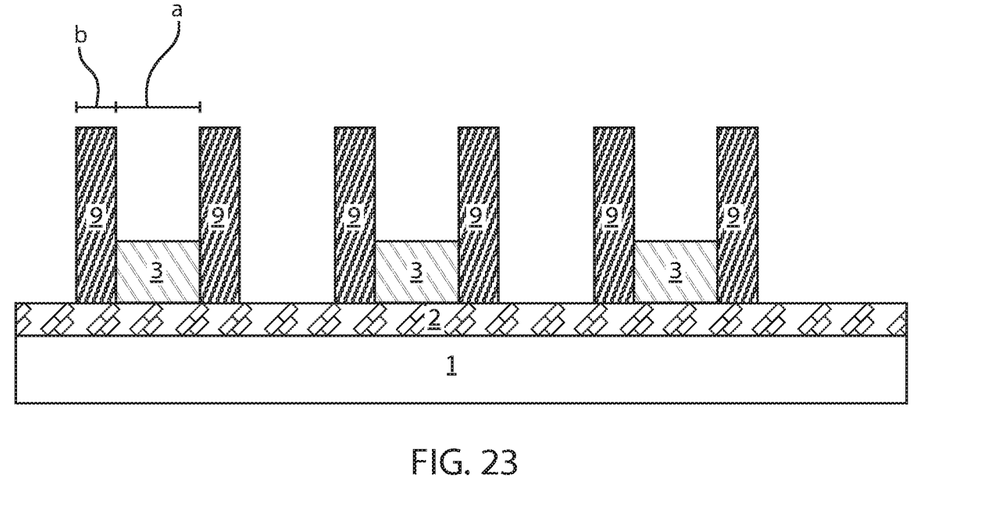
FIG. 23 is a side cross-sectional view depicting one embodiment of a self-aligned quadruple patterning (SAQP) process that begins with the sidewall spacers being formed on a double mandrel structure, in which the upper layer of the double mandrel structure has been removed, in accordance with one embodiment of the present disclosure.

FIG. 23 depicts one embodiment of a self-aligned quadruple patterning (SAQP) process that begins with the sidewall spacers 9 being formed on a double mandrel structure 10, as described with reference to FIG. 5, in which the upper layer, i.e., cap mandrel layer 4, of the double mandrel structure has been removed. The cap mandrel layer 4 of the double mandrel structure 10 may be removed using a selective etch process. In some embodiments, a form of masking may be employed in combination with the selective etch process to remove the cap mandrel layer 4 of the double mandrel structures 10. For example, removing the cap mandrel layer 4 from the double mandrel structures employ a process sequence that includes the process flow described above with reference to FIGS. 9 and 10.

The etch process removes the cap mandrel layer 4 without removing the sidewall spacers 9. The sidewall spacers 9 that originally formed on the sidewall of the double mandrel structures 10 is hereafter referred to as the first sidewall spacers 9. The first sidewall spacers 9 provide a second mandrel structure for forming a second sidewall spacer 27.

Figure 24:
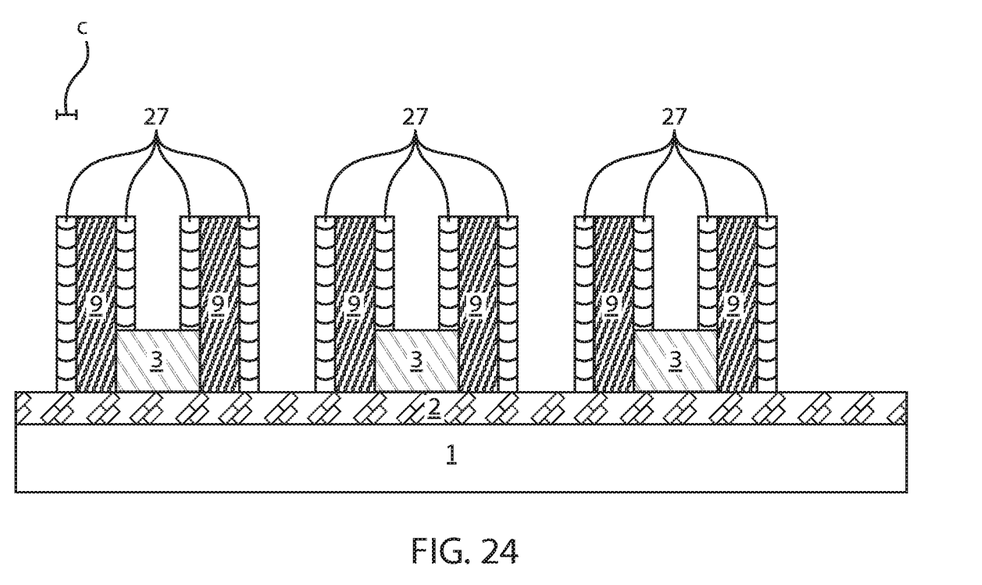
FIG. 24 is a side cross-sectional view depicting forming a second conformal dielectric layer on the structure depicted in FIG. 23 followed by a spacer etch back process.

FIG. 24 describes forming the second sidewall spacers 27. FIG. 24 depicts forming a second conformal dielectric layer on the structure depicted in FIG. 23 followed by a spacer etch back process to provide the second sidewall spacers 27. The second sidewall spacers 27 that are described in FIG. 24 are a different material to the first sidewall spacers 9. For example, the conformal deposited dielectric spacer material layer 9' that is depicted being formed in FIG. 4 is suitable for describing at least one embodiment of a conformal deposited material layer for forming the second sidewall spacers 27 that are depicted being formed in FIG. 24. The dielectric spacer material for the second sidewall spacers 27 may comprise any dielectric spacer material such as, silicon nitride. The spacer etch back process for forming the second sidewall spacers 27 may be an anisotropic etch process, such as reactive ion etching (RIE). The directional nature of the anisotropic etch removes the horizontally orientated portions of the dielectric spacer material, in which the vertically orientated portions remain to provide the second sidewall spacers 27.

Figure 25:
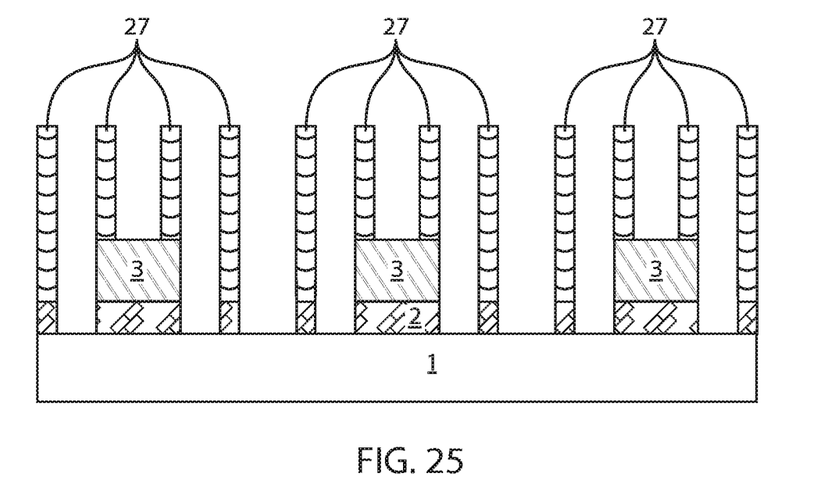
FIG. 25 is a side cross-sectional view depicting removing the first spacer from the structure depicted in FIG. 24.

FIG. 25 depicts removing the first sidewall spacer 9 from the structure depicted in FIG. 24. The first sidewall spacer 9 may be removed by an etch process that is selective to at least the base mandrel layer 3, spacer 27 and the at least one hard mask dielectric layer 2. Wet removal of Spacer 9 is generally preferred to achieve better selectivity. Following removal of the first sidewall spacer 9, the base mandrel layer 3 and the second sidewall spacer 27 are employed as a mask to etch the underling material layers, such as the at least one hardmask dielectric layer 2.

Figure 26:
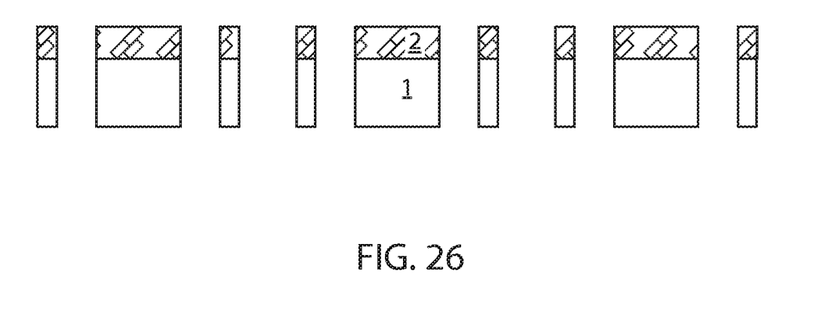
FIG. 26 is a side cross-sectional view depicting using the structure depicted in FIG. 25 as an etch mask for etching the underlying dielectric layers.

FIG. 26 depicts using the structure depicted in FIG. 25 as an etch mask for etching the underlying dielectric layers, e.g., the at least one hardmask dielectric layer 2. The etch process may be an anisotropic etch, such as reactive ion etching (RIE). In one embodiment, the etch mask depicted in FIG. 26 when employed in a front end of the line (FEOL) process may provide two fin structures from the underlying material layer, e.g., semiconductor containing substrate 5. In one embodiment, the etch mask depicted in FIG. 26 may be employed in a back end of the line (BEOL) process to provide three copper lines. Following etch processes for forming the fin structures and/or metal lines, the second sidewall spacers 27 may be removed by a selective etch. In some embodiments, the base mandrel layer 3 of the mandrel structures may be removed by a burn off process. The pitch provided by the self-aligned quadruple patterning (SAQP) process is provided by the pitch of the first sidewall spacers 9 and the second sidewall spacers 27.

It is to be understood that aspects of the present invention will be described in terms of a given illustrative architecture; however, other architectures, structures, substrate materials and process features and steps can be varied within the scope of aspects of the present invention.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a spacer image transfer with a double mandrel structure (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A patterning method for microelectronic devices comprising:
    forming a material stack on a surface to be etched, wherein the material stack of at least a first material layer atop the surface to be etched for a base mandrel layer, and a second material layer atop the first material layer to provide a cap mandrel layer;
    patterning the material stack to provide double mandrel structures each including said base mandrel layer and said cap mandrel layer; and
    forming a sidewall spacer on sidewalls of the double mandrel structures, wherein the cap mandrel layer extends to an upper surface of the sidewall spacer and both the base mandrel layer and the cap mandrel layer contact an inner sidewall of the sidewall spacer, wherein both the base mandrel layer and the cap layer of the double mandrel structure are present in an etch step to etch a hardmask layer.

2. The method of claim 1, wherein the base mandrel layer comprises a Ti containing material.

3. The method of claim 1, wherein the cap mandrel layer comprises an amorphous silicon containing material.

4. The method of claim 1, wherein said forming the sidewall spacer comprises:
  depositing a spacer material layer using a conformal deposition process; and
  etching the spacer material layer with an anisotropic etch process to remove horizontally orientated portions of the spacer material layer, wherein vertically orientated portions of the spacer material layer remain to provide the sidewall spacer.

5. The method of claim 1 further comprising etching the surface to be etched in a non-mandrel portion of a mask provided by the double mandrel structures and the sidewall spacer.

6. The method of claim 5, further comprising etching the surface to be etched in a mandrel portion of a mask provided by the sidewall spacers following removing the cap mandrel layer and the base mandrel layer of the double mandrel structures.

7. The method of claim 5, wherein the etching using the non-mandrel portion of the mask is conducted before the etching using the mandrel portion of the mask.

8. A patterning method for microelectronic devices comprising:
  forming a material stack on a surface to be etched, wherein the material stack of at least a first material layer atop dielectric layers to be etched for a base mandrel layer, and a second material layer atop the first material layer to provide a cap mandrel layer;
  patterning the material stack to provide double mandrel structures each including said base mandrel layer and said cap mandrel layer;
  forming a sidewall spacer on sidewalls of the double mandrel structures, wherein the cap mandrel layer extends to an upper surface of the sidewall spacer and both the base mandrel layer and the cap mandrel layer contact an inner sidewall of the sidewall spacer;
  etching trenches in the dielectric layers using the double mandrel structures and sidewall spacers, wherein both the base mandrel layer and the cap layer of the double mandrel structure are present during etching of the dielectric layers; and
  filling the trenches with an electrically conductive material to provide metal lines.

9. The method of claim 8, wherein said forming the sidewall spacer comprises:
  depositing a spacer material layer using a conformal deposition process; and
  etching the spacer material layer with an anisotropic etch process to remove horizontally orientated portions of the spacer material layer, wherein vertically orientated portions of the spacer material layer remain to provide the sidewall spacer.

10. The method of claim 8, wherein said trenches are etched in the dielectric layers using a non-mandrel portion of the mask provided by the double mandrel structures and the sidewall spacer.

11. The method of claim 8, wherein said trenches are etched in the dielectric layers using a mandrel portion of a mask provided by the sidewall spacers following removing the cap mandrel layer and the base mandrel layer of the double mandrel structures.

12. The method of claim 11, wherein the etching using the non-mandrel portion of the mask is conducted before the etching using the mandrel portion of the mask, or the etching using the non-mandrel portion of the mask is conducted after the etching using the mandrel portion of the mask.

13. The method of claim 8, wherein the sidewall spacer present on sidewalls of the double mandrel structure is a first sidewall spacer, wherein the method further comprises:
  removing the cap mandrel layer selectively to the base mandrel layer;
  forming second sidewall spacers on inner and outer sidewalls of the first sidewall spacer;
  removing the first sidewall spacer; and
  etching the dielectric layers using a mask provided by the second sidewall spacers and the base dielectric layer of the double mandrel structures.

14. A patterning method for microelectronic devices comprising:
  forming a material stack on a surface to be etched, wherein the material stack of at least a first material layer atop semiconductor layers to be etched for a base mandrel layer, and a second material layer atop the first material layer to provide a cap mandrel layer;
  patterning the material stack to provide double mandrel structures each including said base mandrel layer and said cap mandrel layer;
  forming a sidewall spacer on sidewalls of the double mandrel structures, wherein the cap mandrel layer extends to an upper surface of the sidewall spacer and both the base mandrel layer and the cap mandrel layer contact an inner sidewall of the sidewall spacer; and
  etching fins in the semiconductors layers using the double mandrel structures and sidewall spacers wherein both the base mandrel layer and the cap layer of the double mandrel structure are present during etching of the fins in the semiconductors layers using the double mandrel structures.

15. The method of claim 14, wherein said fins are etched in the semiconductor layers using a non-mandrel portion of the mask provided by the double mandrel structures and the sidewall spacer.

16. The method of claim 14, wherein said fins are etched in the semiconductor layers using a mandrel portion of a mask provided by the sidewall spacers following removing the cap mandrel layer and the base mandrel layer of the double mandrel structures.

17. The method of claim 14, wherein the etching using the non-mandrel portion of the mask is conducted before the etching using the mandrel portion of the mask, or the etching using the non-mandrel portion of the mask is conducted after the etching using the mandrel portion of the mask.

18. The method of claim 14, wherein the sidewall spacer present on sidewalls of the double mandrel structure is a first sidewall spacer, wherein the method further comprises:
  removing the cap mandrel layer selectively to the base mandrel layer;
  forming second sidewall spacers on inner and outer sidewalls of the first sidewall spacer;
  removing the first sidewall spacer; and
  etching the semiconductor layers using a mask provided by the second sidewall spacers and the base dielectric layer of the double mandrel structures.

* * * * *